(12) United States Patent
Chang

(10) Patent No.: US 7,692,957 B2
(45) Date of Patent: Apr. 6, 2010

(54) PHASE CHANGE MEMORY DEVICE WITH ENSURED SENSING MARGIN AND METHOD OF MANUFACTURING THE SAME

(75) Inventor: Heon Yong Chang, Kyoungki-do (KR)

(73) Assignee: Hynix Semiconductor Inc., Kyoungki-do (KR)

(*) Notice: Subject to any disclaimer, the term of this patent is extended or adjusted under 35 U.S.C. 154(b) by 142 days.

(21) Appl. No.: 11/647,729

(22) Filed: Dec. 29, 2006

(65) Prior Publication Data

US 2008/0101111 A1 May 1, 2008

(30) Foreign Application Priority Data

Oct. 31, 2006 (KR) .................. 10-2006-0106899

(51) Int. Cl.
*G11C 11/00* (2006.01)

(52) U.S. Cl. .................. 365/163; 365/148; 365/63; 365/206

(58) Field of Classification Search ............ 365/63–72, 365/163, 46, 94, 100, 113, 129, 148, 206, 365/214; 257/2–5, 296, E31.047, E27.006; 438/95, 96, 166, 365, 482, 486, 597, 29, 438/259; 977/754
See application file for complete search history.

(56) References Cited

U.S. PATENT DOCUMENTS

| | | | | |
|---|---|---|---|---|
| 6,274,453 | B1* | 8/2001 | Schlosser et al. | 438/386 |
| 2003/0185049 | A1* | 10/2003 | Fricke et al. | 365/170 |
| 2005/0169327 | A1* | 8/2005 | Eden et al. | 372/29.02 |
| 2007/0109482 | A1* | 5/2007 | Kim | 349/144 |
| 2007/0181932 | A1* | 8/2007 | Happ et al. | 257/314 |

\* cited by examiner

*Primary Examiner*—Richard Elms
*Assistant Examiner*—Harry W Byrne
(74) *Attorney, Agent, or Firm*—Ladas & Parry LLP

(57) ABSTRACT

A phase change memory device includes a semiconductor substrate having a plurality of bar-type active areas. A plurality of word lines are arranged in a direction perpendicular to the active areas on the semiconductor substrate, and a first pair of the word lines connected to each other at each first end thereof is arranged alternately with a second pair of the word lines connected to each other at each second end thereof opposite to the first end. Source areas and drain areas are formed in the active areas. Common source areas are each connected to the source areas. A plurality of lower electrodes are connected to the respective drain areas. Phase change layers make contact with every two diagonally adjoining lower electrodes. Upper electrodes are formed on the phase change layers, and bit lines are arranged in a direction of the active areas and are connected to the upper electrodes.

15 Claims, 6 Drawing Sheets

PHASE CHANGE MEMORY DEVICE WITH ENSURED SENSING MARGIN AND METHOD OF MANUFACTURING THE SAME

CROSS-REFERENCES TO RELATED APPLICATIONS

The present application claims priority to Korean patent application number 10-2006-0106899, filed on Oct. 31, 2006, which is incorporated by reference in its entirety.

BACKGROUND OF THE INVENTION

The present invention relates to a phase change memory device and a manufacturing method thereof, and more particularly to a phase change memory device capable of ensuring a sensing margin, and a manufacturing method thereof.

Memory devices may be categorized into a Random Access Memory (RAM) or a Read Only Memory (ROM) device. RAM devices are volatile memory devices (such as Dynamic RAM, i.e., DRAM, and Static RAM, i.e., SRAM), which will lose input information when power is off. The ROM devices are non-volatile memory devices (such as flash memory and Electrically Erasable Programmable ROM, i.e., EEPROM), which preserves the stored state of input information even when power is off.

Although DRAMs are considered very good memory devices, there are known difficulties for high integration as each DRAM requires a high charge storage capacity leading to increased electrode surface area. High integration is also considered to be difficult for flash memories as each flash memory having a laminated structure of two gates requires an operational voltage higher than its power source voltage and thus requires a separate booster circuit in order to establish the voltage necessary for write and erase operations.

Thus, studies were made to develop a new type of highly integratable non-volatile memory device having a simple and not unduly complicated structure. A phase change memory (in particular, a phase change RAM) is one such non-volatile memory device being researched.

A phase change memory device is a memory device in which the current flow between upper and lower electrodes causes the phase change layer interposed between the electrodes to undergo a phase change between a crystalline phase and an amorphous phase. The resistance difference of the phase change of the phase change layer is then used to discern the types of information stored in the memory cell. More specifically, the phase change memory device uses a Chalcogenide layer, a compound layer of Germanium (Ge), Stibium (Sb) and Tellurium (Te), as the phase change layer. Joule heat generated through the application of a current causes the Chalcogenide layer to undergo a phase change between a crystalline phase and an amorphous phase. Here, because the phase change layer has a higher resistance when in the amorphous phase as compared to the crystalline phase, the phase change memory uses a read mode to distinguish whether the information stored in the phase change memory cell corresponds to logic "1" or logic "0" by detecting the current flowing through the phase change layer.

In such a phase change memory device, the laminated pattern of the phase change layer and the upper electrode is formed within the unit phase change cell. The small size of the phase change layer results in changes in the composition of the phase change layer caused by an etching loss and so forth.

A proposed solution to this problem is a structure in which, as illustrated in FIG. 1, a phase change layer 130 and an upper electrode 132 are formed across two adjoining phase change cells. In such a structure, the phase change layer 130 is larger while each side edge of the phase change layer 130 is removed with respect to the two adjoining phase change cells. Thus, as compared to a structure in which each phase change cell is formed with a phase change layer, the afore-described memory device reduces etching losses, thereby avoiding changes at the edges of a phase change layer.

In FIG. 1, the reference numerals 100, 102, 110, 112, 118, 120, 122, 124, 134, 140 designate the following: a semiconductor substrate 100; an active area 102; a word line 110, 112; a contact plug 118; a lower electrode 120; a common source line 122; a lower electrode contact plug 124; an upper electrode contact plug 134; and a bit line 140.

The conventional phase change memory device having the above-described structure decreases the amount of variation in the current required for the phase change of a phase change layer by reducing the etching loss of the phase change layer; however, the phase change memory device suffers from characteristic deterioration because an undesired thermal phase change occurs between two adjoining phase change cells directed toward the bit line, specifically, two phase change cells across which one phase change layer is arranged. Such an undesired phase change is referred to as "thermal cross-talk". For example, thermal cross-talk changes stored data or negatively influences the phase change cell, thereby causing a sensing margin decrease in the sense amp. As a result, despite the reduction in the phase change layer's etching loss, the thermal cross-talk causes the deterioration of the above-mentioned conventional phase change memory device's desired characteristics.

BRIEF SUMMARY OF THE INVENTION

Embodiments of the present invention are directed to a phase change memory device that can suppress thermal cross-talk, and to a manufacturing method thereof.

Embodiments of the present invention are further directed to a phase change memory device that can ensure desired characteristics by suppressing thermal cross-talk, and to a manufacturing method thereof.

In one aspect of the present invention, there is provided a phase change memory device including: an array of a plurality of phase change cells, each including a lower electrode, a phase change layer and an upper electrode, wherein each phase change layer and each upper electrode have a structure in which the phase change layer forms a laminated pattern with the upper electrode, and each laminated pattern of the phase change electrode and the upper electrode is arranged across two diagonally adjoining phase change cells.

In an embodiment, the laminated patterns of the phase change layer and the upper electrode may be arranged in the same diagonal direction.

In another embodiment, the laminated patterns of the phase change layer and the upper electrode may be alternately arranged in a diagonal direction and in an opposite diagonal direction.

The lower electrode may be formed in each phase change cell.

In another aspect of the present invention, there is provided a phase change memory device including: a semiconductor substrate having a plurality of bar-type active areas; a plurality of word lines formed on the semiconductor substrate such that they are arranged in a direction perpendicular to the active areas and in which a first pair of word lines connected to each other at each first end thereof is arranged alternately with a second pair of word lines connected to each other at each second end thereof opposite to the first end; source areas formed in the respective active areas between the first and second pairs of word lines; drain areas formed in the respective active areas between the word lines of the first pairs of word lines and between the word lines of the second pairs of word lines; common source areas, each formed such that they connect to the source areas formed between the first and second pairs of world lines; a plurality of lower electrodes formed on the active areas such that they connect to the respective drain areas; phase change layers formed in such a manner so as to make contact with every two lower electrodes that adjoin each other in a diagonal direction among the plurality of lower electrodes; upper electrodes formed on the respective phase change layers; and bit lines formed such that they are arranged in the direction of the active areas and connected to the upper electrodes.

This phase change memory device may further include contact plugs interposed between the respective source areas and the common source areas and interposed between the respective drain areas and the respective lower electrodes.

This phase change memory device may further include lower electrode contact plugs interposed between the respective lower electrodes and the respective phase change layers.

This phase change memory device may further include upper electrode contact plugs interposed between the respective upper electrodes and the respective bit lines.

Each phase change layer and each upper electrode may have a structure in which the phase change layer forms a laminated pattern with the upper electrode.

The laminated patterns of the phase change layer and the upper layer may be arranged in the same diagonal direction.

The laminated patterns of the phase change layer and the upper electrode may be alternately arranged in a diagonal direction and in an opposite diagonal direction.

In yet another aspect of the present invention, there is provided a method of manufacturing a phase change memory device, the method including the steps of: forming a plurality of word lines on a semiconductor substrate, which has a plurality of bar-type active areas, such that they are arranged in a direction perpendicular to the active areas and such that the first pair of word lines connected to each other at each first end thereof is arranged alternately with a second pair of word lines connected to each other at each second end thereof opposite to the first end; forming source areas in the respective active areas between the first and second pairs of word lines, and forming drain areas in the respective active areas between the word lines of the first pair of word lines and between the word lines of the second pair of word lines; forming a plurality of lower electrodes such that they connect to the respective drain areas, and forming common source areas such each common source area connects to the source areas formed between the first and second pairs of world lines; forming phase change layers in such a manner so as to make contact with every two adjoining lower electrodes in a diagonal direction among the plurality of lower electrodes, and forming upper electrodes in a laminated pattern with the respective phase change layers; and forming bit lines in such a manner such that they are arranged in the direction of the active areas and connected to the upper electrodes.

This method of manufacturing a phase change memory device may further include the step of, after the step of forming the source areas and the drain areas and before the step of forming the lower electrodes and the common source areas, forming contact plugs on the source areas and the drain areas.

This method of manufacturing a phase change memory device may further include the step of, after the step of forming the upper electrodes and the common source areas and before the step of forming the phase change layers and the upper electrodes, forming lower electrode contact plugs in such a manner so as to make contact with the lower electrodes.

This method of manufacturing a phase change memory device may further include the step of, after the step of forming the phase change layers and the upper electrodes and before the step of forming the bit lines, forming upper electrode contact plugs in such a manner so as to make contact with the upper electrodes.

DESCRIPTION OF SPECIFIC EMBODIMENTS

In the present invention, a phase change layer and an upper electrode have a structure in which the phase change layer forms a laminated pattern with the upper electrode, and the laminated pattern is arranged across two diagonally adjoining phase change cells. Consequently, the present invention prevents a composition change of the phase change layer's edges by etching loss. Further, because the distance between two diagonally adjoining phase change cells is longer than that of two phase change cells adjoining each other in the direction of the bit lines, the present invention can prevent thermal cross-talk between two adjoining phase change cells sharing one phase change layer, thus preserving the desired characteristics of the phase change memory device.

Reference will now be made in detail to phase change memory devices according to preferred embodiments of the present invention and a manufacturing method thereof with reference to the accompanying drawings.

Figure 1:
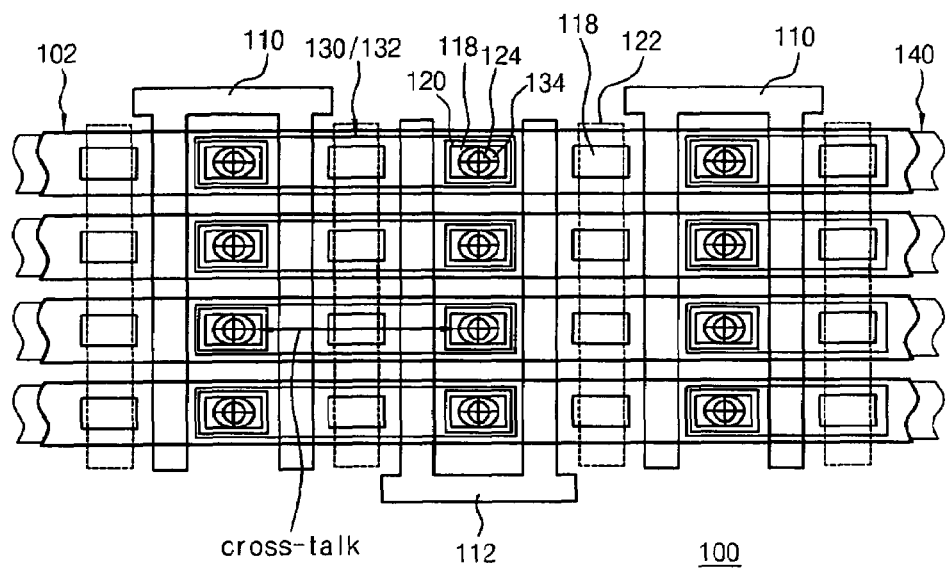
FIG. 1 is a plan view illustrating a phase change memory device according to prior art.
Figure 2:
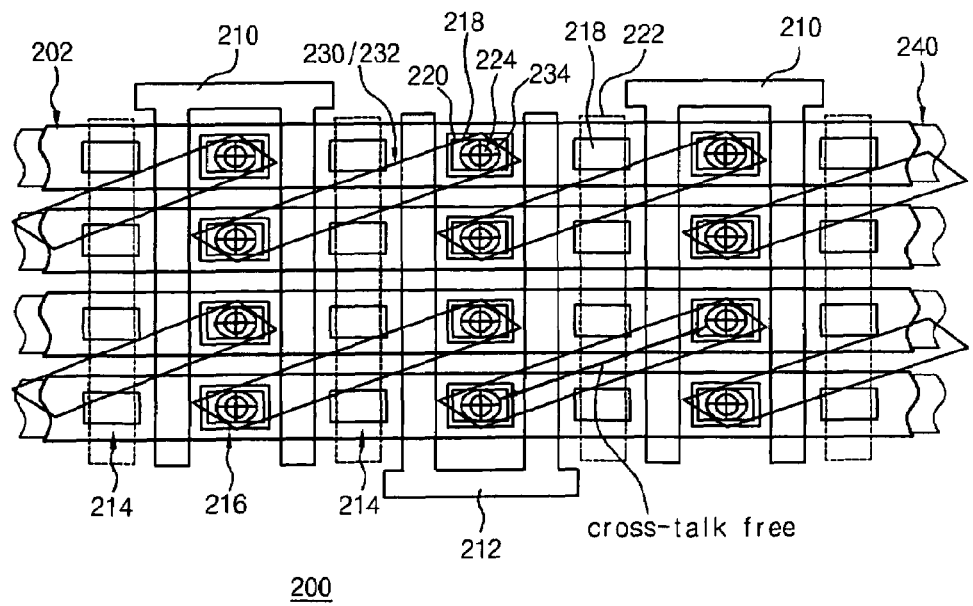
FIG. 2 is a plan view illustrating a phase change memory device in accordance with a preferred embodiment of the present invention.

FIG. 2 is a plan view of a phase change memory device according to a preferred embodiment of the present invention. As illustrated in the drawing, on a semiconductor substrate 200 having a plurality of bar-type active areas 202, a plurality of word lines 210, 212 are formed in a direction perpendicular to the active areas 202. The word lines 210, 212 include first pairs of word lines 210 connected to each other at each first end thereof and second pairs of word lines 212 connected to each other at each second end thereof opposite to the first end. The first pairs of word lines 210 and the second pairs of word lines 212 are arranged alternately with each other. Source areas 214 are formed in the respective active areas 202 between the first pairs of word lines 210 and the second pairs 212 of word lines. Drain areas 216 are formed in the respective active areas 202 between the word lines of the first pairs of word lines 210 and between the word lines of the second pairs 212 of word lines.

Contact plugs 218 are formed on the respective source areas 214 and the respective drain areas 216. Further, dot-type lower electrodes are formed on the active areas 202 in such a manner so as to make contact with the contact plugs formed on the respective drain areas 216, and common source areas 222 are formed between the first and second pairs of world lines 210, 212 such that they connect to the source areas 214 via the contact plugs 218.

Lower electrode contact plugs 224 are formed on the respective lower electrodes 220. Laminated patterns, each of which consists of a phase change layer 230 and an upper electrode 232, are arranged across two diagonally adjoining phase change cells and are formed in such a manner so as to make contact with both lower electrodes 220 of the two diagonally adjoining phase change cells via the lower electrode contact plugs 224. Upper electrode contact plugs are formed on the respective upper electrodes 232. Bit lines 240 are formed such that they make contact with the upper electrode contact plugs 234 arranged in the direction of the active areas 202.

According to the above-described embodiment of the present invention, the laminated pattern of the phase change layer and the upper electrode is formed so as to be arranged across two diagonally adjoining phase change cells. Because the distance between the two adjoining phase change cells increases as compared to the conventional structure in which the laminated pattern of the phase change layer and the upper electrode is arranged across two phase change cells adjoining in a bit line direction, it is possible to suppress thermal cross-talk between the two adjoining phase change cells sharing one phase change layer. The phase change memory device of the present invention therefore prevents a composition change and thus a phase change current variation at the edges of the phase change layer by etching loss, and suppresses thermal cross-talk between two adjoining phase change cells, which occurs at the phase change of the phase change layer as the size of the phase change cell decreases, thereby ensuring desired characteristics such as a sufficient sensing margin and so forth.

Further, since the upper electrodes are diagonally arranged with respect to the bit lines, the phase change memory device of the present invention reduces parasitic capacitance between the upper electrodes and the bit lines, as compared to the conventional structure in which the upper electrodes are arranged parallel to the bit lines, thereby improving operational characteristics.

FIGS. 3A to 3G show cross-sectional views for explaining a method of manufacturing a phase change memory device according to a preferred embodiment of the present invention.

Figure 3A:
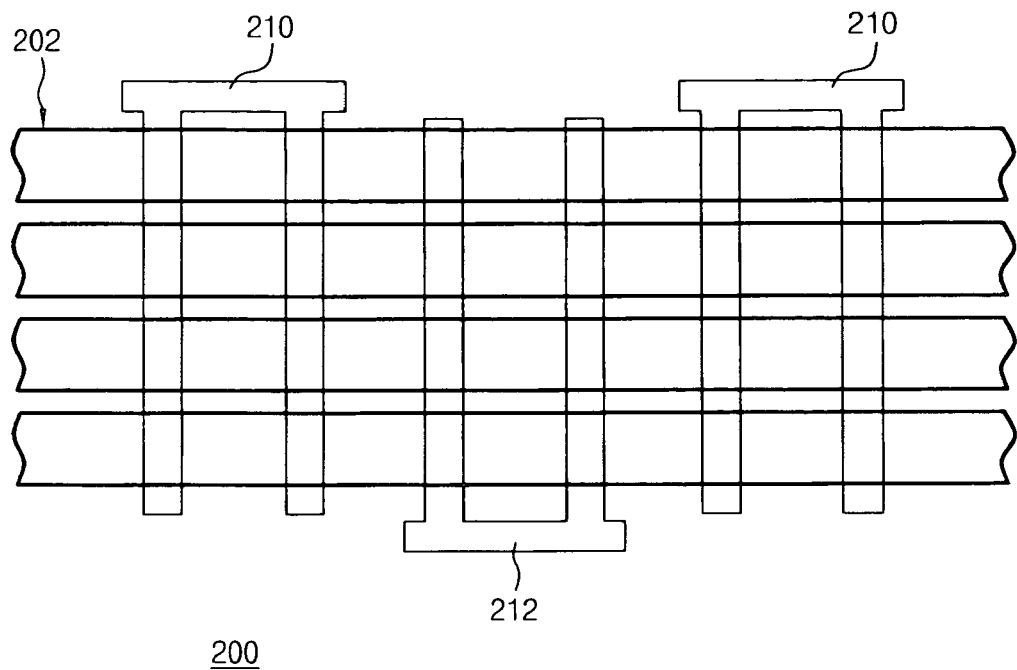
FIGS. 3A to 3G are step-by-step sectional views for explaining a method of manufacturing a phase change memory device in accordance with a preferred embodiment of the present invention.

Referring to FIG. 3A, a plurality of word lines 210, 212 are formed on a semiconductor substrate 200, which has bar-type active areas 202, such that they are arranged in a direction perpendicular to the active areas 202. The bit lines 210, 212 are formed such that the first pair of word lines 210 connected to each other at each first end thereof is arranged alternately with the second pair of word lines 212 connected to each other at each second end thereof opposite to the first end.

Figure 3B:
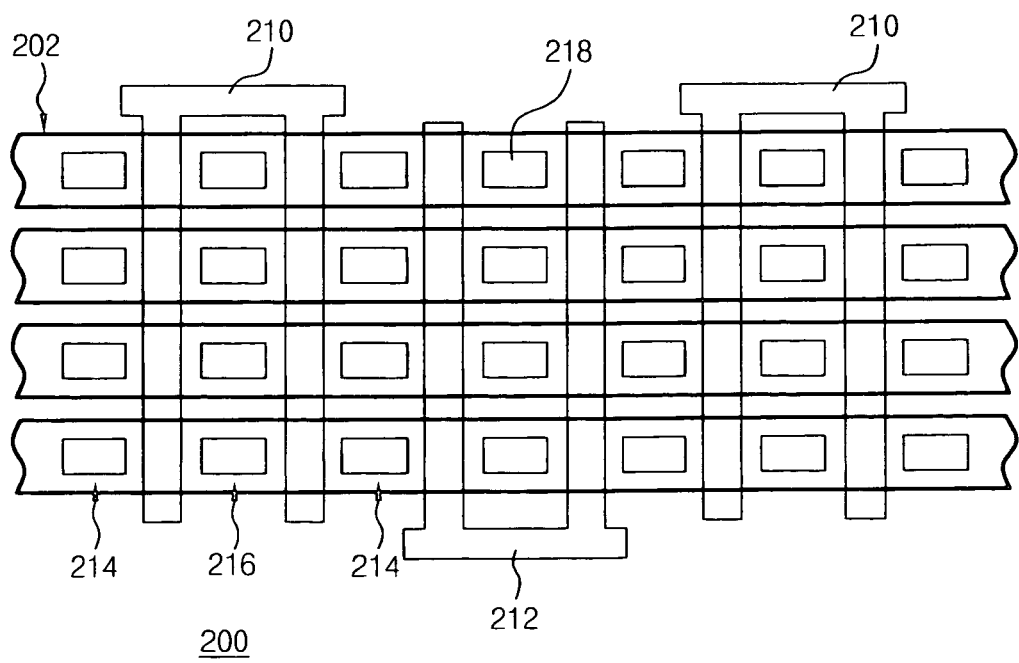

Referring to FIG. 3B, using an ion implantation process, source areas are formed in the active areas between the first and second pairs of word lines 210, 212, and drain areas 216 are formed in the active areas between the word lines of the first pairs of word lines 210 and between the word lines of the second pairs of word lines 212, in which a transistor is constructed. A first insulating layer (not shown) is formed on the semiconductor substrate 200 in which the transistor is constructed. The first insulating layer is etched to form the first contact holes through which the source and drain areas 214, 216 are exposed, respectively. The first contact holes are then filled with an electrically conductive layer, thereby forming contact plugs 218 that make contact with the source and drain areas 214, 216.

Figure 3C:
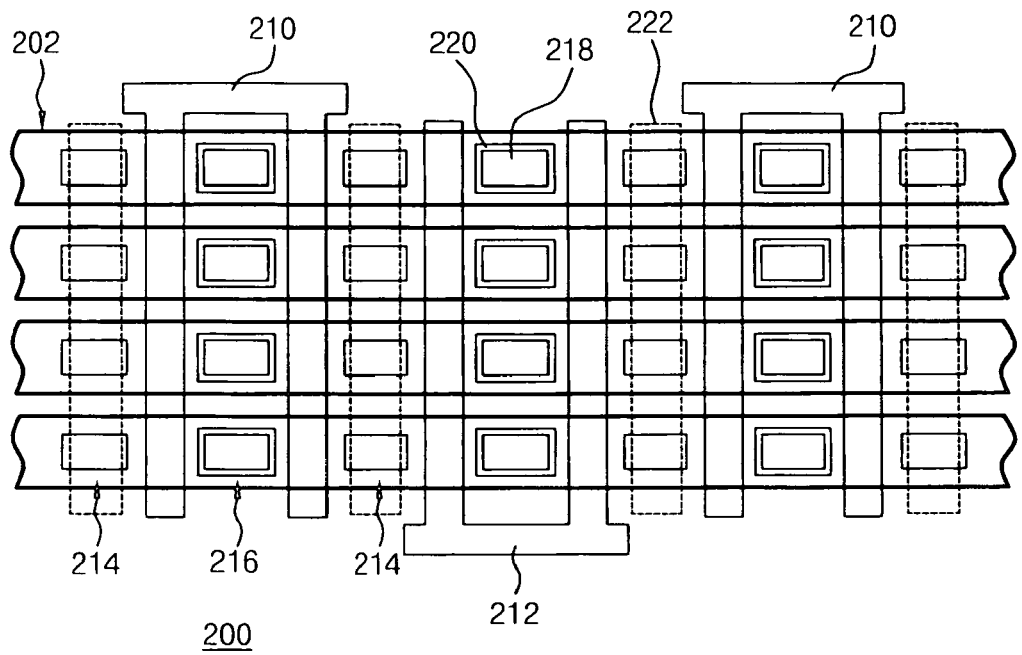

Referring to FIG. 3C, a second insulating layer is formed on the first insulating layer including the contact plugs 218 by using a well-known damascene process. The lower electrodes 220 are then formed such that they make contact with the contact plugs 218 on the respective drain areas 216. Further, common source areas 222 are formed in such that each common source area is arranged between the first and second pairs of word lines 210, 212 and is connected to the source areas 214 through the contact plugs 218 formed on the respective source areas 214.

Figure 3D:
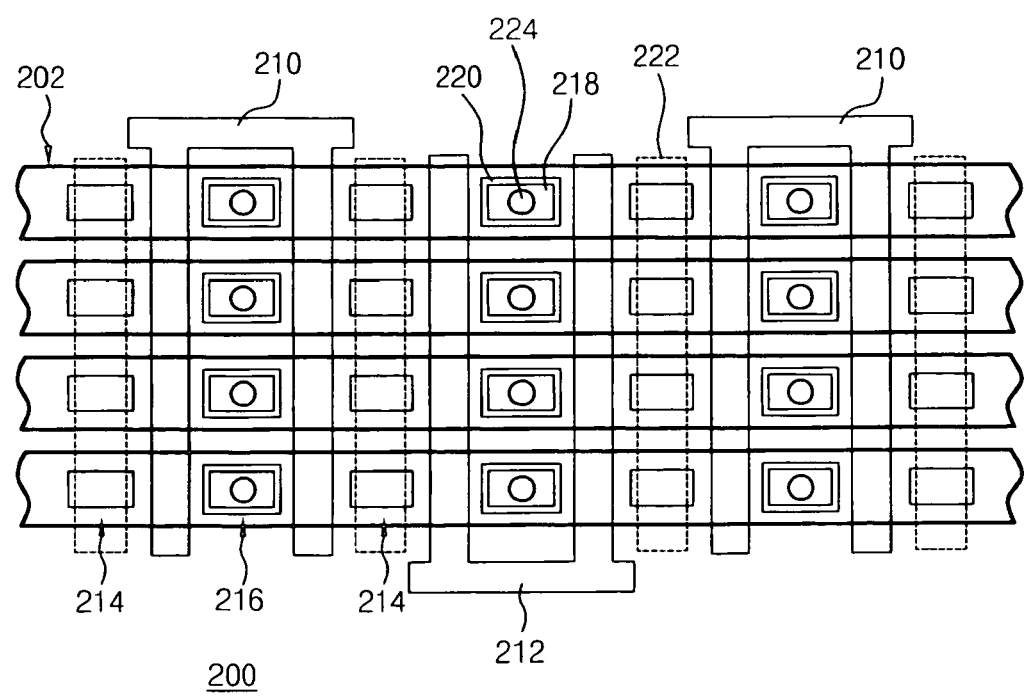

Referring to FIG. 3D, a third insulating layer (not shown) is formed on the second insulating layer including the lower electrodes 220 and the common source areas 222. The third insulating layer is etched to form second contact holes through which the respective lower electrodes 220 are exposed. The second contact holes are then filled with an electgrically conductive layer, thereby forming lower electrode contact plugs 224.

Figure 3E:
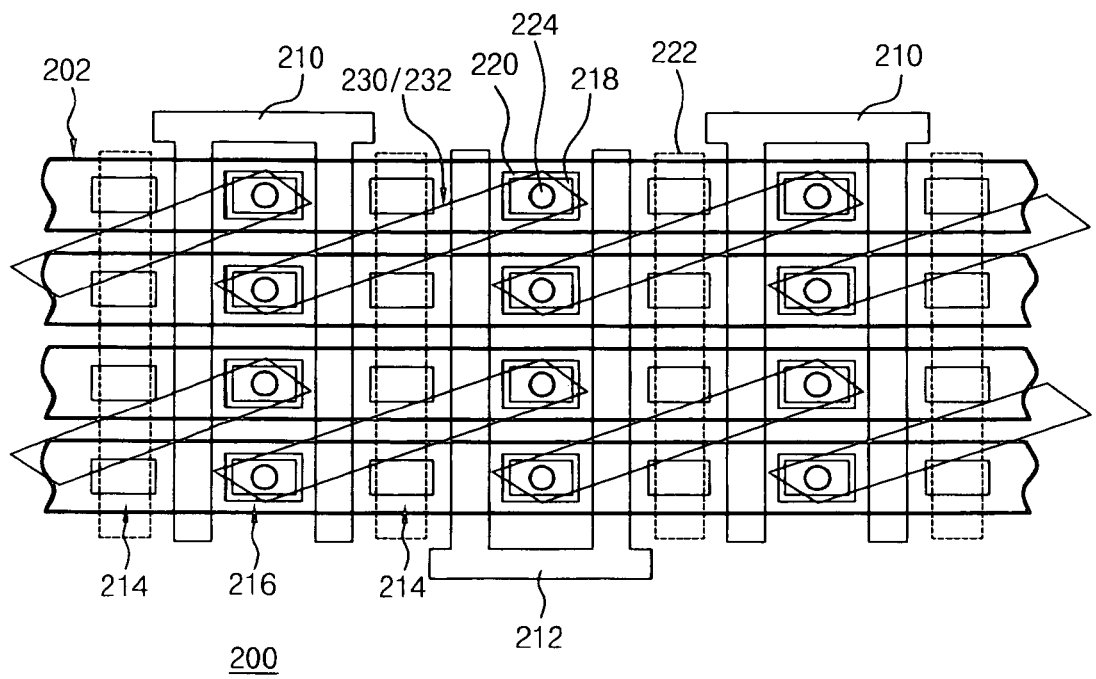

Referring to FIG. 3E, a phase change material layer and an electrically conductive layer for upper electrodes are formed in sequence on the third insulating layer including the lower electrode contact plugs 224, and then the phase change material layer and the electrically conductive layer for upper electrodes are etched to form laminated patterns, each of which consists of a phase change layer 230 and an upper electrode 232 and connects to the lower electrodes of two diagonally adjoining phase change cells via the lower electrode contact plugs 224. Here, the laminated patterns of the phase change layer 230 and the upper electrode 232 are formed they are arranged in the same diagonal direction.

Figure 3F:
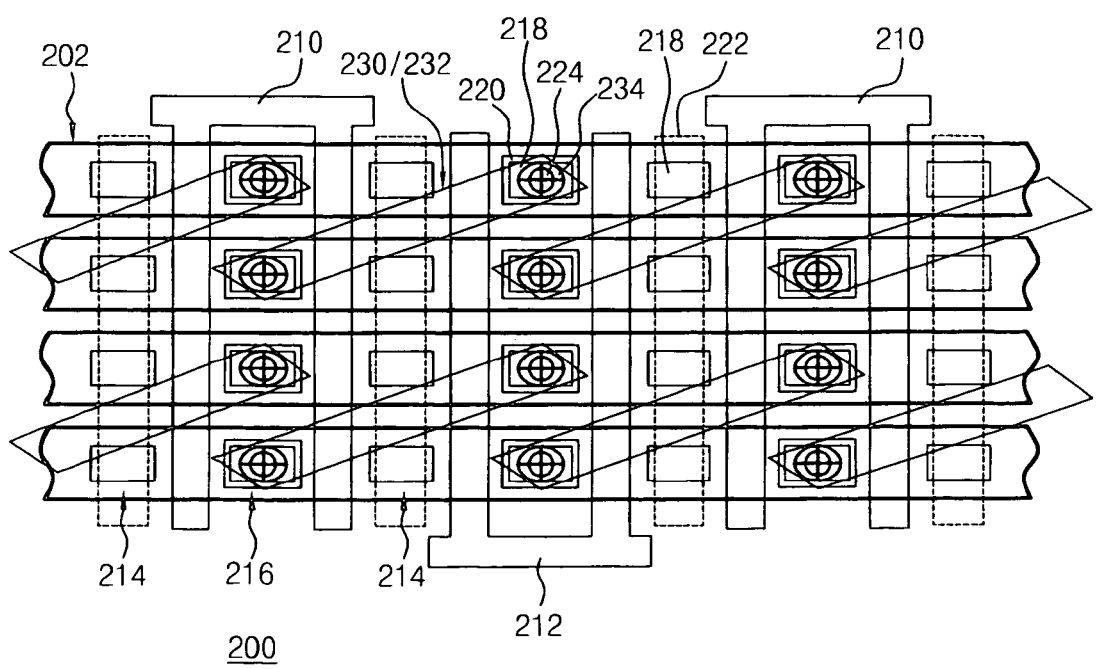

Referring to FIG. 3F, a fourth insulating layer (not shown) is formed on the third insulating layer so as to cover the laminated patterns of the phase change layer 230 and the upper electrode 232. The fourth insulating layer is etched to form third contact holes through which the upper electrodes 232 are exposed, and then the third contact holes are filled with an electrically conductive layer, thereby forming upper electrode contact plugs 234.

Figure 3G:
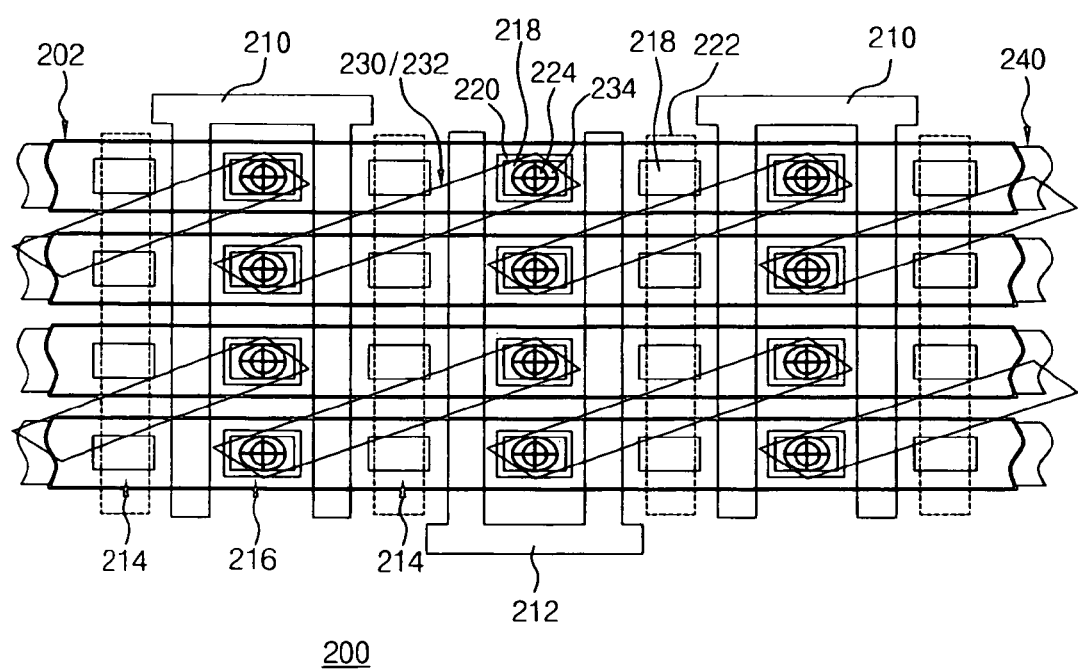

Referring to FIG. 3G, a metal layer for bit lines is deposited on the fourth insulating layer including the upper electrode contact plugs 234 and is etched to form bit lines 240 that are arranged in the direction of the active areas 202 and make contact with the upper electrodes 232 via the upper electrode contact plugs 234.

Figure 4:
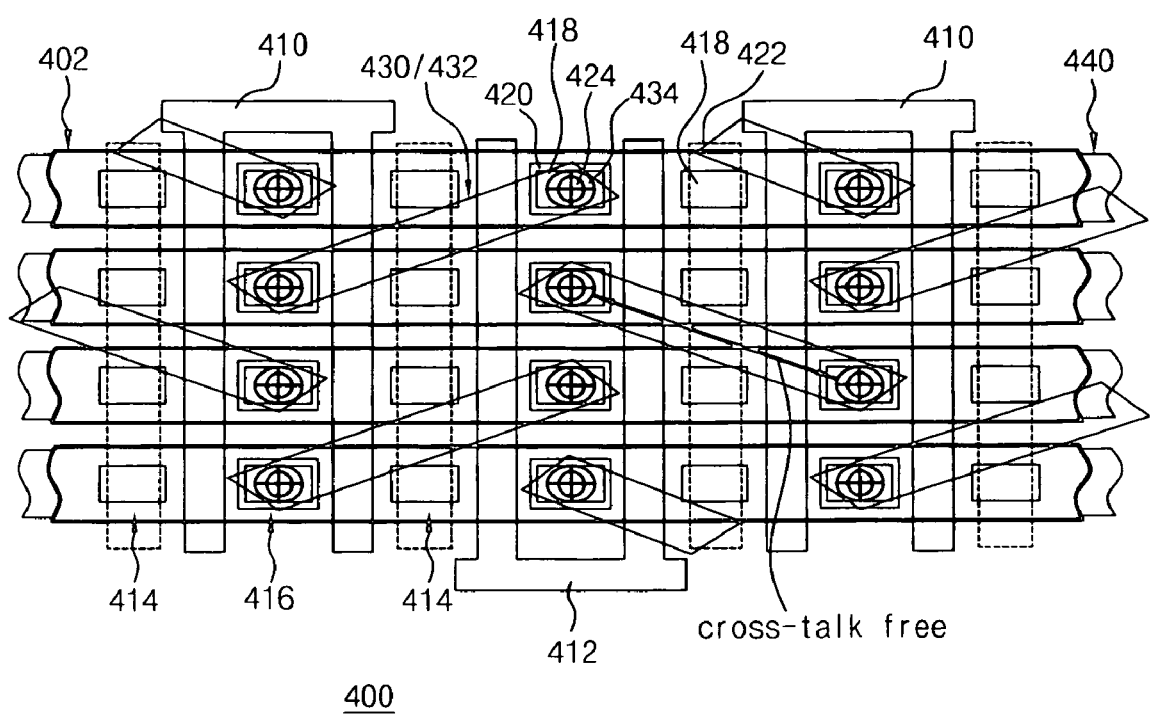
FIG. 4 is a plan view illustrating a phase change memory device in accordance with another preferred embodiment of the present invention.

FIG. 4 illustrates a plan view of a phase change memory device according to another preferred embodiment of the present invention. As illustrated in the FIG. 4, the phase change memory device according to this embodiment is different from the previous embodiment in that laminated patterns, each of which consists of a phase change layer 430 and an upper electrode 432, are not only arranged in the same diagonal direction but are also arranged in a diagonal direction and the opposite diagonal direction. The remaining constitutional elements are formed according to the previous embodiment.

In FIG. 4, the reference numerals 400, 410, 412, 414, 416, 418, 420, 422, 424, 434, 440 designate the following: a semiconductor substrate 400; active areas 402; designate word lines 410, 412; source areas 414; drain areas 416; contact plugs 418; lower electrodes 420; common source areas 422; lower electrode contact plugs 424; upper electrode contact plugs 434; and bit lines 440.

Since the laminated patterns of the phase change layer and the upper electrode are formed so as to be arranged across two diagonally adjoining phase change cells, the phase change memory device according to this embodiment also prevents thermal cross-talk between two adjoining phase change cells sharing one phase change layer. That is, the phase change memory device according to this embodiment not only prevents the composition change of the phase change layer from occurring at its edges but also improves characteristics by virtue of the thermal cross-talk suppression.

As described above, according to the present invention and the manufacturing method thereof, the phase change memory device has a structure in which the laminated pattern of a phase change layer and an upper electrode is arranged across two diagonally adjoining phase change cells. Thus, since etching loss of the phase change layer is reduced, it is possible to suppress composition changes at the edges of the phase change layer, thereby reducing the variation of current required for the phase change of the phase change layer. Further, in view of a trend toward a decrease in the size of a unit phase change cell, it is possible to suppress a thermal cross-talk phenomenon in which, when one of two phase change cells sharing one phase change layer undergoes a phase change, the other phase change cell is also affected by the phase change, and thus desired device characteristics as well as a sensing margin can be ensured. Moreover, device characteristics are further improved because parasitic capacitance of the upper electrode and bit line is reduced.

Although preferred embodiments of the present invention have been described for illustrative purposes, the present invention is not limited thereto, and those skilled in the art will appreciate that various modifications, additions and substitutions are possible, without departing from the scope and spirit of the invention as disclosed in the accompanying claims.

What is claimed is
1. A phase change memory device comprising:
an array of a plurality of phase change cells, each phase change cell comprising a lower electrode, a phase change layer, and an upper electrode,
wherein each phase change layer and each upper electrode have a structure in which the phase change layer forms a laminated pattern with the upper electrode, and each laminated pattern of the phase change layer and the upper electrode is arranged across two diagonally adjoining phase change cells.
2. The phase change memory device of claim 1, wherein the laminated patterns of the phase change layer and the upper electrode are arranged in the same diagonal direction.
3. The phase change memory device of claim 1, wherein the laminated patterns of the phase change layer and the upper electrode are alternately arranged in a diagonal direction and in an opposite diagonal direction.
4. The phase change memory device of claim 1, wherein the lower electrode is formed in each phase change cell.
5. A phase change memory device comprising:
a semiconductor substrate having a plurality of bar-type active areas;
a plurality of word lines formed on the semiconductor substrate such that the word lines are arranged in a direction perpendicular to the active areas and in which a first pair of the word lines connected to each other at each first end thereof is arranged alternately with a second pair of the word lines connected to each other at each second end thereof opposite to the first end;
source areas formed in the respective active areas between the first pairs of the word lines and the second pairs of the word lines;
drain areas formed in the respective active areas between the word lines of the first pairs of the word lines and between the word lines of the second pairs of the word lines;
common source areas, each formed to be connected to the source areas formed between the first and second pairs of the world lines;
a plurality of lower electrodes formed on the active areas such that the lower electrodes are connected to the respective drain areas;
phase change layers formed to make contact with every two lower electrodes which adjoin each other in a diagonal direction among the plurality of lower electrodes;
upper electrodes formed on the respective phase change layers; and
bit lines formed to be arranged in a direction of the active areas and be connected to the upper electrodes.
6. The phase change memory device of claim 5, further comprising contact plugs interposed between the respective source areas and the common source areas and interposed between the respective drain areas and the respective lower electrodes.
7. The phase change memory device of claim 5, further comprising lower electrode contact plugs interposed between the respective lower electrodes and the respective phase change layers.
8. The phase change memory device of claim 5, further comprising upper electrode contact plugs interposed between the respective upper electrodes and the respective bit lines.
9. The phase change memory device of claim 5, wherein each phase change layer and each upper electrode have a structure in which the phase change layer forms a laminated pattern with the upper electrode.
10. The phase change memory device of claim 9, wherein the laminated patterns of the phase change layer and the upper layer are arranged in the same diagonal direction.
11. The phase change memory device of claim 9, wherein the laminated patterns of the phase change layer and the upper electrode are alternately arranged in a diagonal direction and in an opposite diagonal direction.
12. A method of manufacturing a phase change memory device, the method comprising the steps of:
forming a plurality of word lines on a semiconductor substrate, which has a plurality of bar-type active areas, such that the word lines are arranged in a direction perpendicular to the active areas and such that a first pair of the word lines connected to each other at each first end thereof is arranged alternately with a second pair of the word lines connected to each other at each second end thereof opposite to the first end;
forming source areas in the respective active areas between the first pair of the word lines and the second pair of the word lines, and forming drain areas in the respective active areas between the word lines of the first pair of the word lines and between the word lines of the second pair of the word lines;
forming a plurality of lower electrodes to be connected to the respective drain areas, and forming common source areas such that each common source area is connected to the source areas formed between the first and second pairs of the world lines;
forming phase change layers to make contact with every two lower electrodes which adjoin each other in a diagonal direction among the plurality of lower electrodes, and forming upper electrodes in a laminated pattern with the respective phase change layers; and
forming bit lines to be arranged in a direction of the active areas and be connected to the upper electrodes.
13. The method of claim 12, further comprising the step of, after the step of forming the source areas and the drain areas and before the step of forming the lower electrodes and the common source areas, forming contact plugs on the source areas and the drain areas.

14. The method of claim 12, further comprising the step of, after the step of forming the upper electrodes and the common source areas and before the step of forming the phase change layers and the upper electrodes, forming lower electrode contact plugs to make contact with the lower electrodes.

15. The method of claim 12, further comprising the step of, after the step of forming the phase change layers and the upper electrodes and before the step of forming the bit lines, forming upper electrode contact plugs to make contact with the upper electrodes.

* * * * *